(12) United States Patent
Dobashi

(10) Patent No.: US 7,078,753 B2
(45) Date of Patent: Jul. 18, 2006

(54) IMAGE SENSOR

(75) Inventor: Hideki Dobashi, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 11/067,083

(22) Filed: Feb. 25, 2005

(65) Prior Publication Data

US 2005/0190453 A1    Sep. 1, 2005

(30) Foreign Application Priority Data

Mar. 1, 2004    (JP)    .............................. 2004-056667

(51) Int. Cl.
*H01L 31/0232* (2006.01)
*H01L 31/113* (2006.01)
*G02B 27/10* (2006.01)

(52) U.S. Cl. ...................... 257/294; 257/291; 257/435; 359/622; 359/626

(58) Field of Classification Search ................ 257/222, 257/223, 290, 291, 292, 293, 294, 432, 435, 257/436, 443; 359/619, 621, 622, 626, 894
See application file for complete search history.

(56) References Cited

U.S. PATENT DOCUMENTS

| | | | | |
|---|---|---|---|---|
| 5,321,297 | A | * | 6/1994 | Enomoto .................... 257/432 |
| 5,371,397 | A | * | 12/1994 | Maegawa et al. ........... 257/432 |
| 5,844,290 | A | * | 12/1998 | Furumiya .................... 257/432 |
| 6,489,624 | B1 | * | 12/2002 | Ushio et al. ............. 250/559.27 |
| 2003/0168679 | A1 | * | 9/2003 | Nakai et al. ................ 257/291 |
| 2005/0236553 | A1 | * | 10/2005 | Noto et al. ............... 250/208.1 |
| 2006/0006485 | A1 | * | 1/2006 | Mouli ........................ 257/432 |

FOREIGN PATENT DOCUMENTS

| | | | |
|---|---|---|---|
| JP | 5-235313 A | 9/1993 | |
| JP | 05273495 A | * 10/1993 | ..................... 27/18 |
| JP | 6-224398 A | 8/1994 | |

* cited by examiner

Primary Examiner—Minhloan Tran
Assistant Examiner—Victor A. Mandala, Jr.
(74) Attorney, Agent, or Firm—Morgan & Finnegan LLP

(57) ABSTRACT

It is an object of this invention to provide the structure of an image sensor capable of efficiently collecting light in the center and in the periphery of an imaging plane. To achieve this object, an image sensor includes a plurality of photoelectric conversion portions, a high refractive index portion having a first portion formed into the shape of a pillar and a taper shape portion whose aperture area increases toward a side close to a photographing lens, and a low refractive index portion placed around the high refractive index portion. Letting x1 be an aperture width on the side at which the aperture area of the taper shape is large, x2 be an aperture width on the side at which the aperture area of the taper shape is small, θ° be the inclination angle of the taper shape, n1 be the refractive index of the high refractive index portion, n2 be the refractive index of the low refractive index portion, F be the F number of the photographing lens, R be the distance from the center of the optical axis of the photographing lens to the photoelectric conversion portion, and f be the distance from the position of the pupil of the photographing lens to an imaging plane, the high refractive index portion is formed into a shape which satisfies relations represented by $1 > x2/x1 \geq (1-\tan\theta/\tan\theta')/(1+\tan\theta/\tan\theta')$ and $\cos\theta' \geq n2/n1$ where $\theta' = \theta0' + 2\theta$ and $\sin\theta0' = \frac{1}{2}n1F + R/n1f$.

5 Claims, 18 Drawing Sheets

FIG. 13

CENTRAL PORTION

| θ | 15 | 16 | 17 | 18 | 19 | 20 |
|---|---|---|---|---|---|---|
| θ' | 35.12 | 37.12 | 39.12 | 41.12 | 43.12 | 45.12 |
| x2/x1 | 0.448 | 0.450 | 0.454 | 0.458 | 0.462 | 0.468 |
| X1(max) | 2.68 | 2.66 | 2.65 | 2.62 | 2.60 | 2.56 |
|  | OK | OK | OK | OK | NG | NG |

FIG. 14

PERIPHERAL PORTION

| $\theta$ | 10 | 11 | 12 | 13 | 14 | 15 |
|---|---|---|---|---|---|---|
| $\theta'$ | 37.87 | 39.87 | 41.87 | 43.87 | 45.87 | 47.87 |
| x2/x1 | 0.630 | 0.622 | 0.617 | 0.613 | 0.610 | 0.610 |
| X1(max) | 1.90 | 1.93 | 1.95 | 1.96 | 1.97 | 1.97 |
|  | OK | OK | OK | NG | NG | NG |

FIG. 15

CENTRAL PORTION

| θ | 20 | 21 | 22 | 23 | 24 | 25 |
|---|---|---|---|---|---|---|
| θ' | 35.40 | 37.40 | 39.40 | 41.40 | 43.40 | 45.40 |
| x2/x1 | 0.323 | 0.332 | 0.341 | 0.350 | 0.360 | 0.370 |
| X1(max) | 3.72 | 3.62 | 3.52 | 3.43 | 3.33 | 3.24 |
|  | OK | OK | OK | OK | NG | NG |

FIG. 16

PERIPHERAL PORTION

| θ | 20 | 21 | 22 | 23 | 24 | 25 |
|---|---|---|---|---|---|---|
| θ' | 39.97 | 41.97 | 43.97 | 45.97 | 47.97 | 49.97 |
| x2/x1 | 0.394 | 0.402 | 0.410 | 0.418 | 0.427 | 0.437 |
| X1(max) | 3.04 | 2.99 | 2.93 | 2.87 | 2.81 | 2.75 |
|  | OK | OK | NG | NG | NG | NG |

IMAGE SENSOR

FIELD OF THE INVENTION

The present invention relates to the internal structure of an image sensor which senses an image of an object.

BACKGROUND OF THE INVENTION

Japanese Patent Laid-Open No. 05-235313 discloses a technique which aims to increase the light-collecting efficiency by forming a total reflection structure inside an image sensor. FIG. 17 shows a structure based on an embodiment in Japanese Patent Laid-Open No. 05-235313. In this structure, the value of D/L which is the ratio of the pitch to the depth of the image sensor is 1, and an angle θ of an inclined total reflection surface is about 26.5°. This structure makes it possible to collect light without lowering the light-concentrating efficiency around the center of an imaging plane even when no microlens is used.

Also, Japanese Patent Laid-Open No. 06-224398 discloses a structure for efficiently collecting light incident on an image sensor. FIG. 18 shows a structure based on an embodiment in Japanese Patent Laid-Open No. 06-224398. A resin cap layer 10 is made of a material having a refractive index of about 1.6. A low refractive index layer 9 is made of resin having a refractive index lower than that of the cap layer 10, and has a hollow (filled with air or an inert gas such as nitrogen). Light traveling from the cap layer 10 to the low refractive index layer 9 is totally reflected by the interface when the light exceeds the critical angle. Accordingly, slant incident light can be collected.

Unfortunately, the above conventional examples have the following problems.

In the structure as shown in FIG. 17, of the light totally reflected by the total reflection surface, light directly reaching a light-receiving portion can be received with no problem. However, when light by which the F number of a lens is small is to be collected, light from the periphery of the pupil of the lens sometimes passes through the total reflection surface, without being reflected, when the light is incident on the total reflection surface, since the light does not exceed the critical angle. Also, even when this light is totally reflected, it sometimes passes through a total reflection surface on the opposite side when the light is incident on this total reflection surface, since the light does not exceed the critical angle. To control this state, it is necessary to properly design the dimensional relationship between, e.g., the height of the inclined surface, the incident aperture, and the exit aperture.

Also, in the structure as shown in FIG. 18, the incident side of the high refractive index cap layer 10 is an arc having a small radius. Therefore, when the angle of slant incident light increases, light incident on this arc portion is not totally reflected but passes through it, and enters another pixel.

SUMMARY OF THE INVENTION

The present invention, therefore, has been made in consideration of the above situation, and has as its object to provide the structure of an image sensor capable of efficiently collecting light in the center and in the periphery of an imaging plane, and also capable of collecting slant incident light which changes in accordance with the F number of a photographing lens.

To solve the above problems and achieve the above object, according to a first aspect of the present invention, an image sensor is characterized by comprising a plurality of photoelectric conversion portions each of which photoelectrically converts an object image formed by a photographing lens, a high refractive index portion which is placed on each of the plurality of photoelectric conversion portions to cover at least part of the photoelectric conversion portion, and includes a first portion positioned near the photoelectric conversion portion and formed into a shape of a square pillar or column having a substantially uniform thickness, and a second portion formed contiguously with the first portion and having a taper shape whose aperture area increases from a side close to the photoelectric conversion portion to a side close to the photographing lens, and a low refractive index portion placed around the high refractive index portion, and having a refractive index lower than that of the high refractive index portion, wherein letting x1 be an aperture width on a side at which the aperture area of the taper shape is large, x2 be an aperture width on a side at which the aperture area of the taper shape is small, θ° be an inclination angle of the taper shape, n1 be the refractive index of the high refractive index portion, n2 be the refractive index of the low refractive index portion, F be an F number of the photographing lens, R be a distance from a center of an optical axis of the photographing lens to the photoelectric conversion portion, and f be a distance from a position of a pupil of the photographing lens to an imaging plane in which the plurality of photoelectric conversion portions are arranged, the high refractive index portion is formed into a shape which satisfies relations represented by $$1 > x2/x1 \geq (1-\tan\theta/\tan\theta')/(1+\tan\theta/\tan\theta')$$

$$\cos\theta' \geq n2/n1$$

where $\theta' = \theta0' + 2\theta$ and $\sin\theta0' = \frac{1}{2}n1F + R/n1f$.

Also, according to a second aspect of the present invention, an image sensor is characterized by comprising a plurality of photoelectric conversion portions each of which photoelectrically converts an object image formed by a photographing lens, a microlens which is placed between each of the plurality of photoelectric conversion portions and the photographing lens, and concentrates light to the photoelectric conversion portion, a high refractive index portion which is placed on each of the plurality of photoelectric conversion portions to cover at least part of the photoelectric conversion portion, and includes a first portion positioned near the photoelectric conversion portion and formed into a shape of a square pillar or column having a substantially uniform thickness, and a second portion formed contiguously with the first portion and having a taper shape whose aperture area increases from a side close to the photoelectric conversion portion to a side close to the photographing lens, and a low refractive index portion placed around the high refractive index portion, and having a refractive index lower than that of the high refractive index portion, wherein letting x1 be an aperture width on a side at which the aperture area of the taper shape is large, x2 be an aperture width on a side at which the aperture area of the taper shape is small, θ° be an inclination angle of the taper shape, n1 be the refractive index of the high refractive index portion, n2 be the refractive index of the low refractive index portion, F be an F number of the photographing lens, R be a distance from a center of an optical axis of the photographing lens to the photoelectric conversion portion, f be a distance from a position of a pupil of the photographing lens to an imaging plane in which the plurality of photoelectric conversion portions are arranged, n3 be a refractive index of the microlens, r be an aperture radius of the microlens, and H0 be a distance from an end portion, which is close to the photoelectric conversion portion, of the microlens to the photoelectric conversion portion, the high refractive index portion is formed into a shape which satisfies relations represented by $$1 > x2/x1 \geq (1 - \tan\theta/\tan\theta')/(1 + \tan\theta/\tan\theta')$$

$$\cos\theta' \geq n2/n1$$

where $\theta' = \theta0' + 2\theta$ and $\sin\theta0' = (n3/n1) \cdot (\frac{1}{2}F - r/H0 + R/f)$.

Other objects and advantages besides those discussed above shall be apparent to those skilled in the art from the description of a preferred embodiment of the invention which follows. In the description, reference is made to accompanying drawings, which form a part thereof, and which illustrate an example of the invention. Such example, however, is not exhaustive of the various embodiments of the invention, and therefore reference is made to the claims which follow the description for determining the scope of the invention.

BRIEF DESCRIPTION OF THE DRAWINGS

FIG. 13 is a view showing the values of $\theta'$ corresponding to an inclination angle $\theta$ of a taper portion of the high refractive index portion in the first embodiment;

FIG. 14 is a view showing the values of $\theta'$ corresponding to the inclination angle $\theta$ of the taper portion of the high refractive index portion in the first embodiment;

FIG. 15 is a view showing the values of $\theta'$ corresponding to an inclination angle $\theta$ of a taper portion of the high refractive index portion in the second embodiment;

FIG. 16 is a view showing the values of $\theta'$ corresponding to the inclination angle $\theta$ of the taper portion of the high refractive index portion in the second embodiment;

DETAILED DESCRIPTION OF THE PREFERRED EMBODIMENTS

Preferred embodiments of the present invention will now be described in detail in accordance with the accompanying drawings.

First Embodiment

Figure 1:
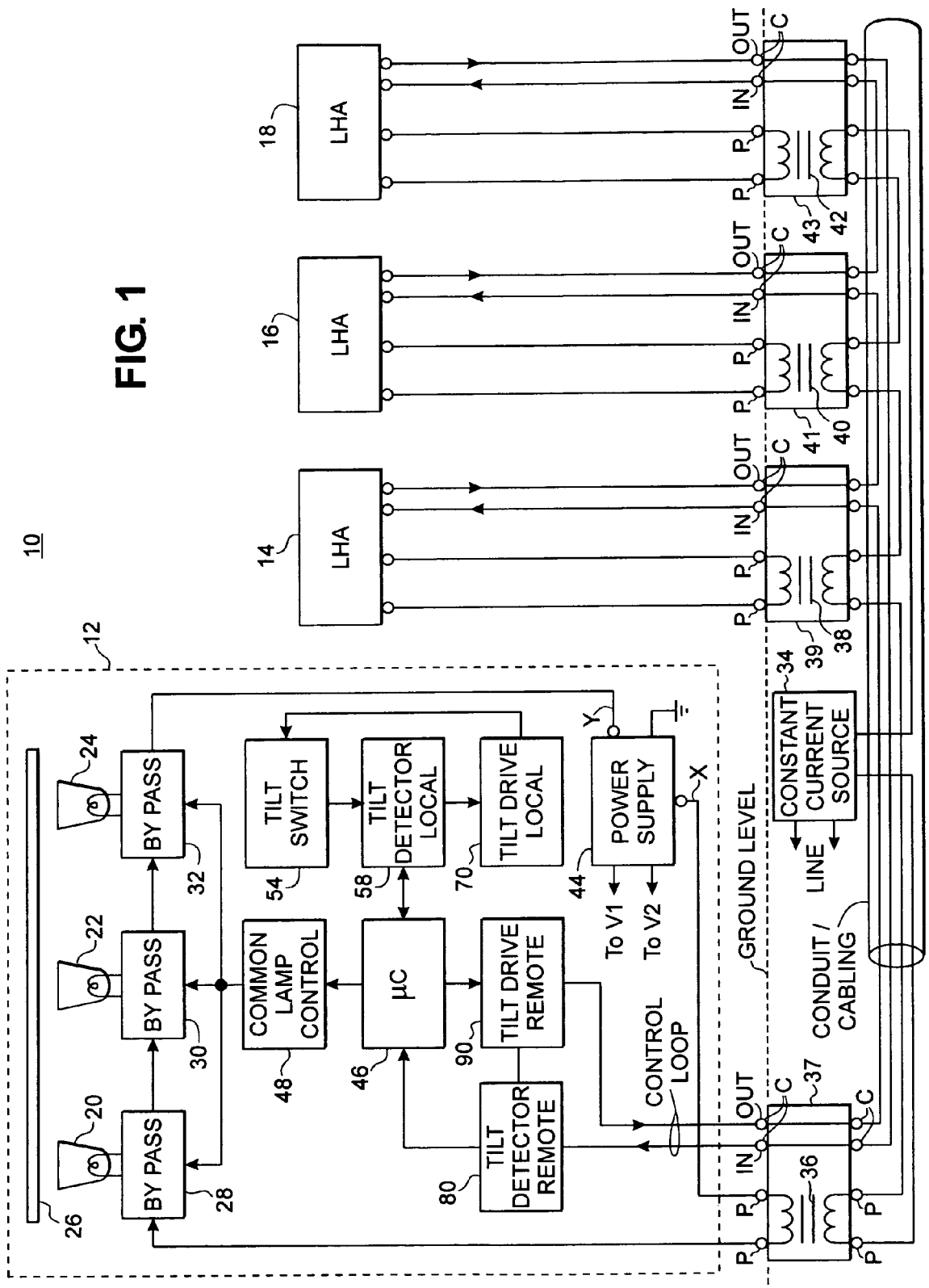
FIG. 1 is a view showing the first embodiment of the present invention.

FIG. 1 shows the first embodiment of the present invention. FIG. 1 is a sectional view of an image sensor. Reference numeral 1 denotes a silicon wafer; 2, a photoelectric conversion portion having a function of converting received photons into electric charge; 3, a high refractive index portion; 4, a low refractive index portion; 5, a poly-Si interconnecting layer which functions as a gate for controlling the electric charge in the photoelectric conversion portion; and 6, an interconnecting layer made of a metal such as aluminum.

Referring to FIG. 1, the high refractive index portion 3 is made of a high refractive index material such as titanium dioxide ($TiO_2$) having a refractive index of 2.5 or silicon nitride (SiN) having a refractive index of 2.0. The low refractive index portion 4 is made of a low refractive index material such as silicon dioxide ($SiO_2$) having a refractive index of 1.46. This forms a so-called light guide in which, of light entering the high refractive index portion 3, light exceeding the critical angle is totally reflected by the interface with the low refractive index portion 4 to reach the photoelectric conversion portion 2.

Figure 2:
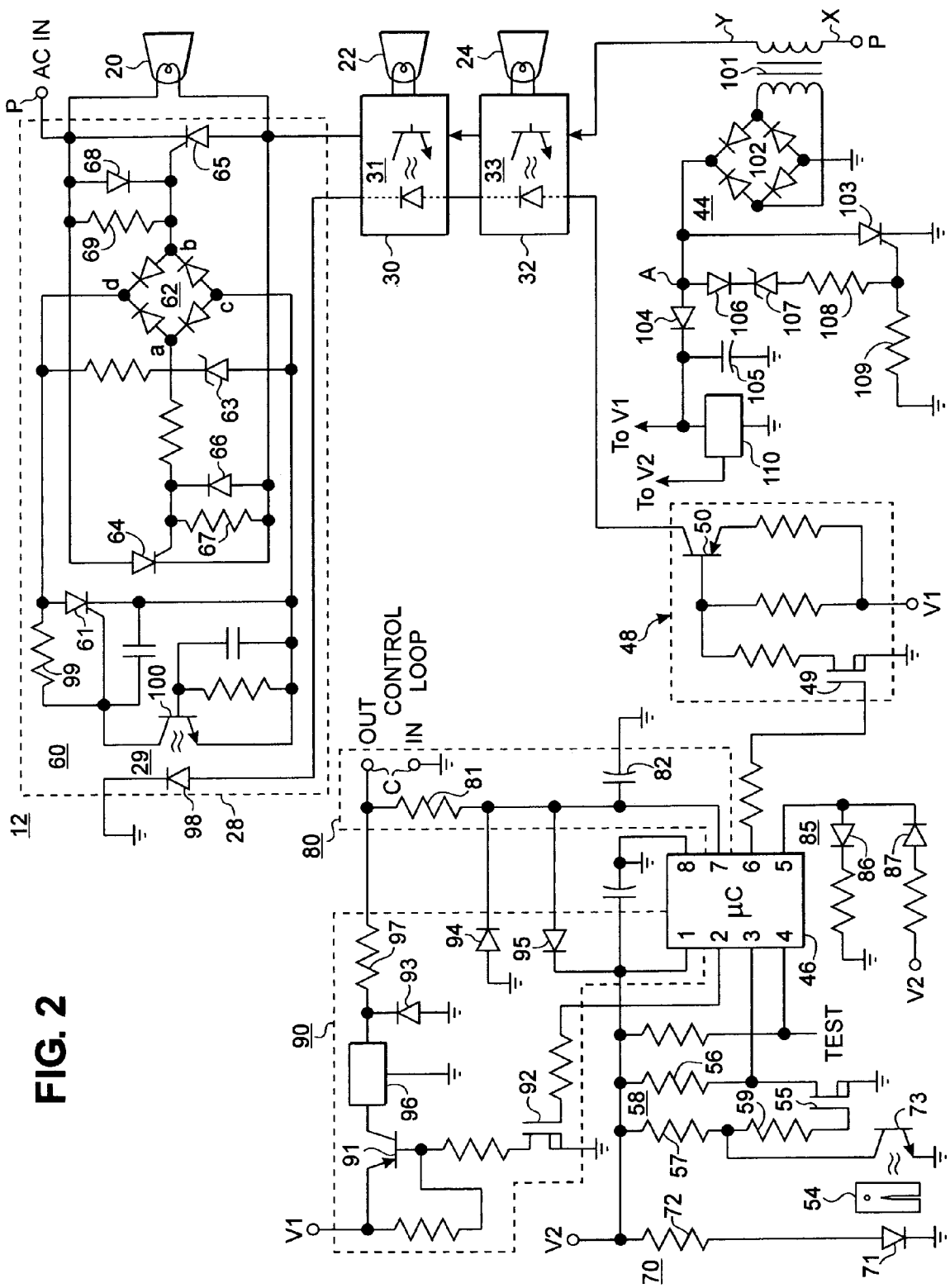
FIG. 2 is a perspective view showing a high refractive index portion of the first embodiment of the present invention.

FIG. 2 specifically shows the high refractive index portion 3 alone to make its shape easy to understand.

The high refractive index portion 3 is made up of a square pillar portion 31 which is close to the photoelectric conversion portion 2 and has surfaces substantially parallel to the optical axis, and a taper portion 32 which is present on the light incident side and has an angle different from the square pillar portion 31. The square pillar portion 31 has a substantially square shape when viewed from the upper surface of the image sensor, and has four surfaces parallel to the optical axis. Although the taper portion 32 also has a substantially square shape when viewed from the upper surface, the size of the section depends on its height. In this embodiment, the high refractive index portion 3 is expressed as a square pillar having a square section. However, the high refractive index portion 3 may also have a rectangular section, a polygonal section such as a pentagonal or hexagonal section, or a circular section (column).

Figure 3:
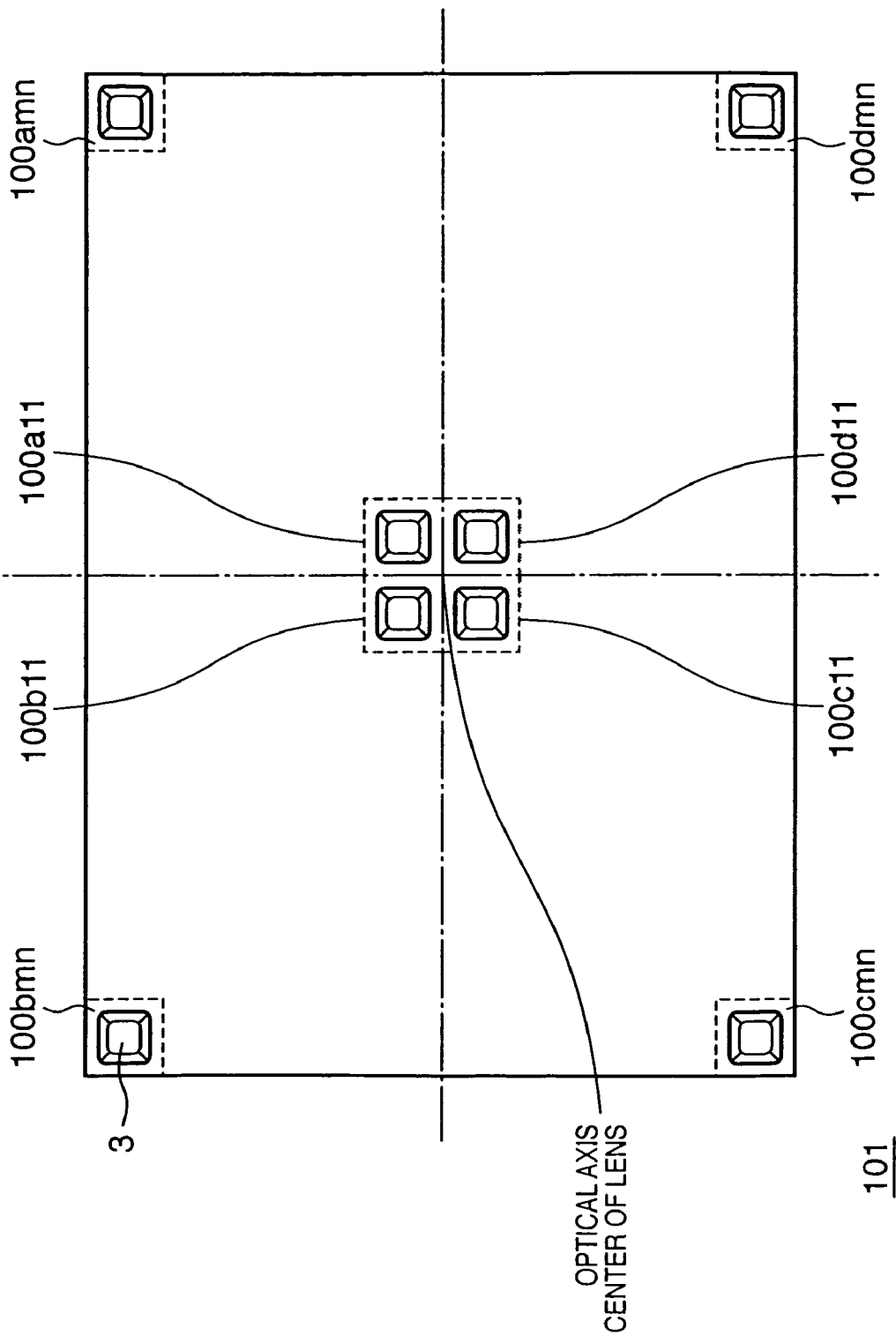
FIG. 3 is a top view showing the high refractive index portion of the first embodiment of the present invention.
Figure 4:
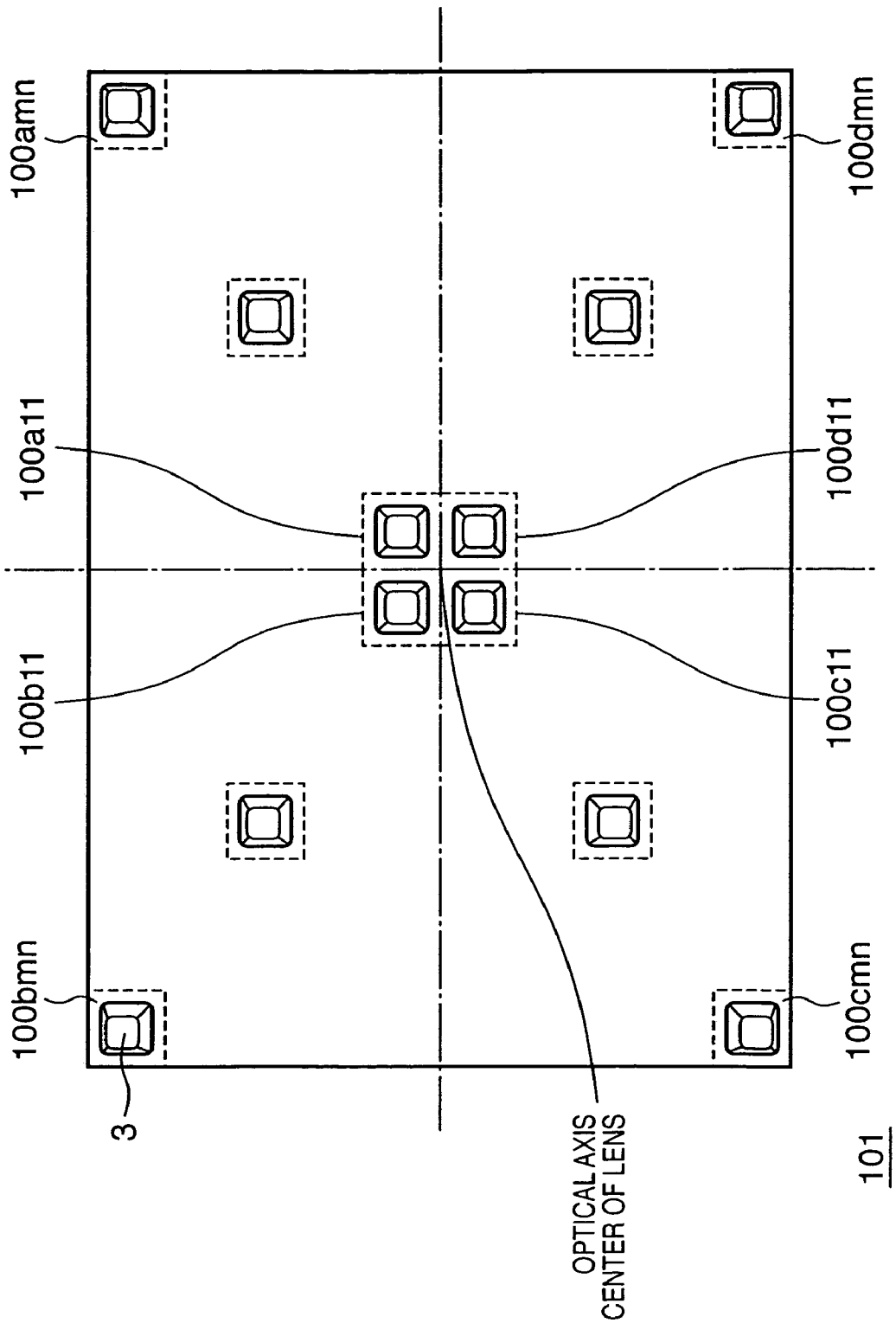
FIG. 4 is a top view showing the high refractive index portion of the first embodiment of the present invention.
Figure 5:
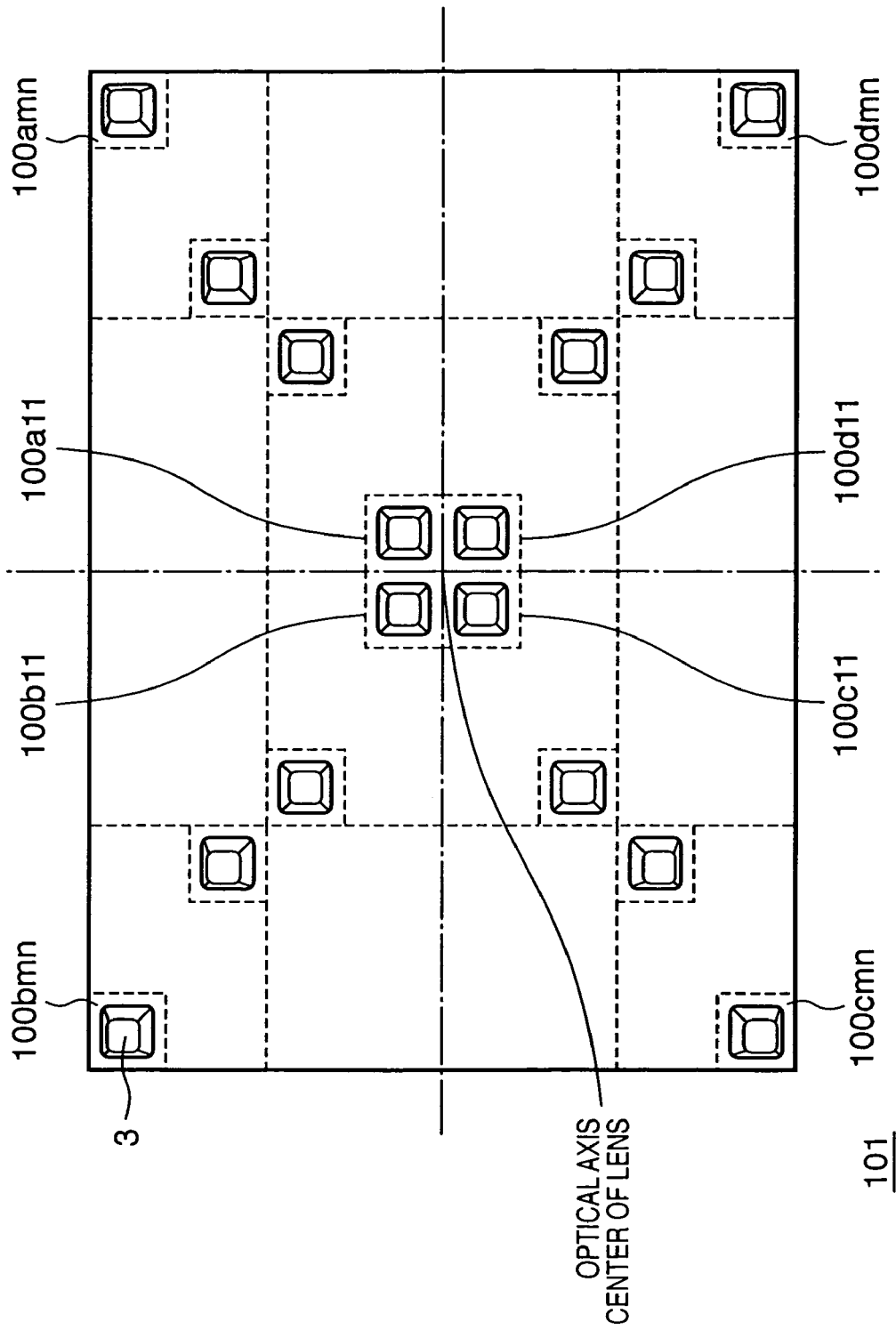
FIG. 5 is a top view showing the high refractive index portion of the first embodiment of the present invention.

FIGS. 3 to 5 illustrate the way the high refractive index portion 3 is tapered when it is viewed from the upper portion of the image sensor. To simplify the explanation, FIGS. 3 to 5 express only pixels close to the center of the optical axis of the photographing lens and pixels in the four corners (diagonal portions).

The shape of the taper portion 32 can be any of three shapes: an entirely uniform shape (FIG. 3); a shape (FIG. 4) in which the shape of each pixel changes in the direction of the center of the optical axis of the photographing lens in accordance with the distance from the optical axis; and a shape (FIG. 5) in which, although the shapes of pixels are different as in FIG. 4, the pixel shape changes for each unit including a few pixels. In either case, the taper shape must be formed to satisfy relations to be presented later.

As a method of forming the high refractive index portion 3 having any of these shapes, the low refractive index portion 4 is formed flat and coated with a resist, and then etching is performed to form a hole close to the photoelectric conversion portion 2. After that, the material (e.g., SiN) of the high refractive index portion 3 is deposited by evaporation. The taper portion can be given a desired shape by controlling the etching conditions when the hole is formed.

Figure 6:
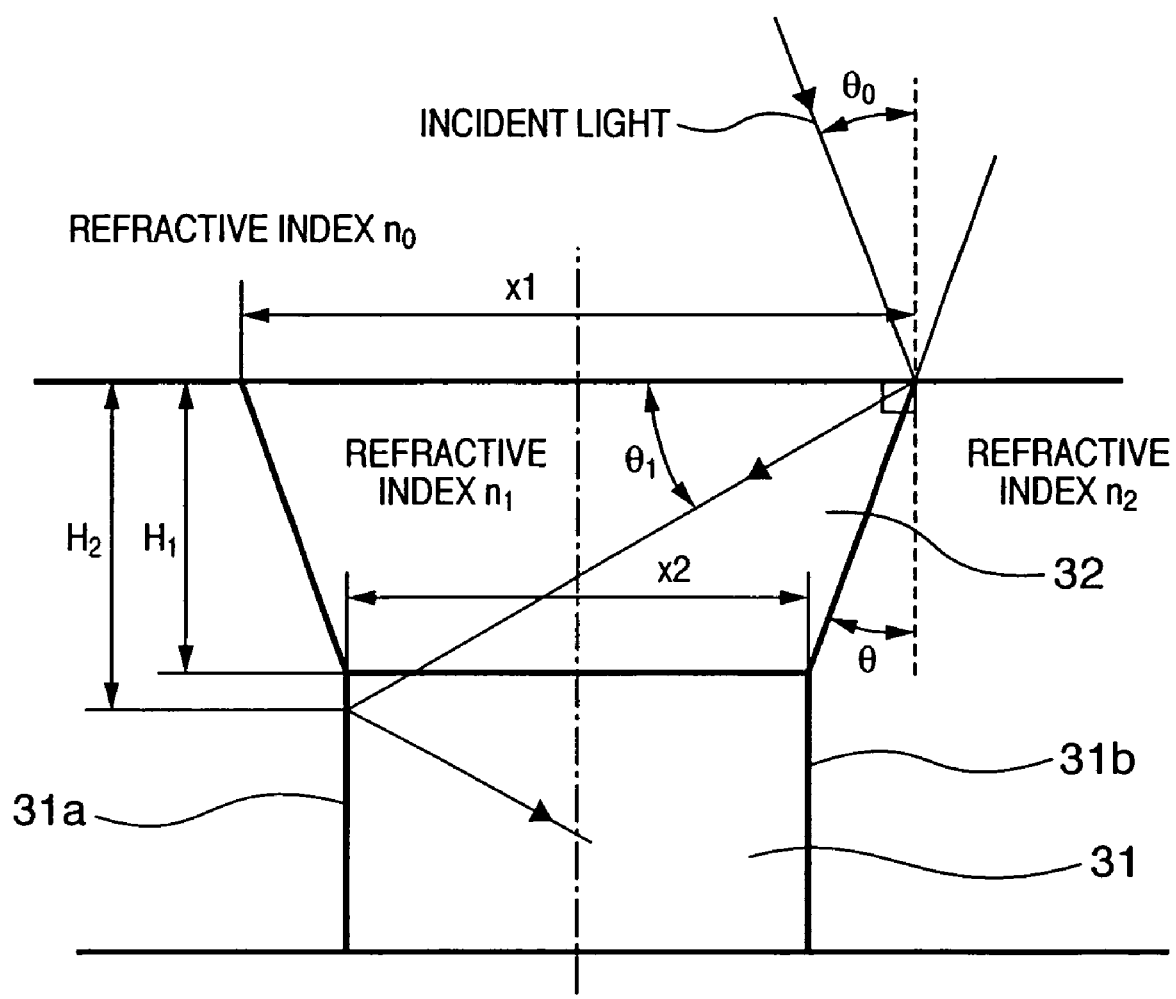
FIG. 6 is a view showing the state of light in the high refractive index portion.
Figure 7:
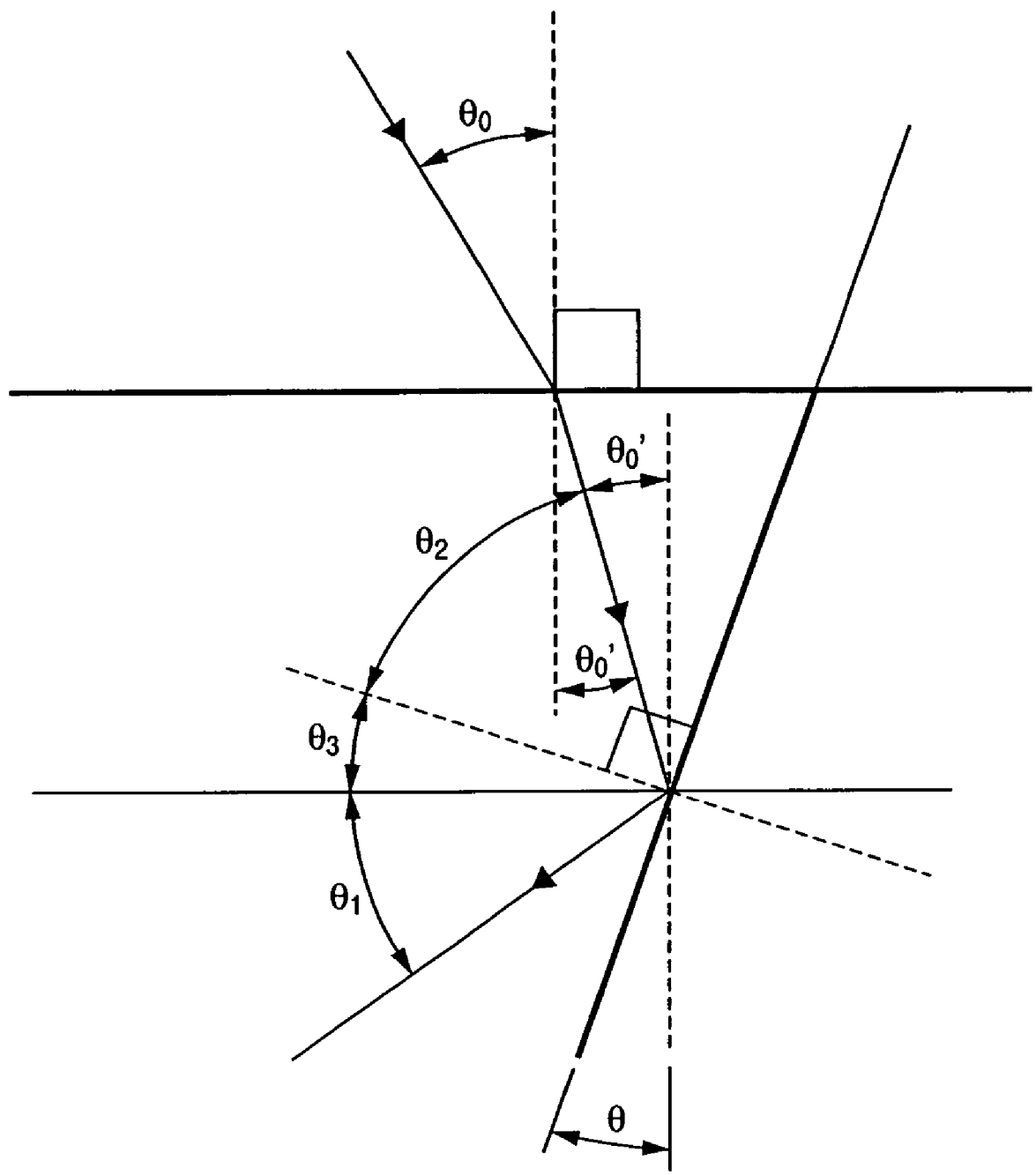
FIG. 7 is a partially enlarged view showing the state of light in the high refractive index portion.

The dimensional relationship of the taper portion will be explained below. FIG. 6 is a sectional view of one pixel of the image sensor including a plurality of pixels. FIG. 7 is a partially enlarged view of the taper portion 32 having the shape of a well.

Figure 8:
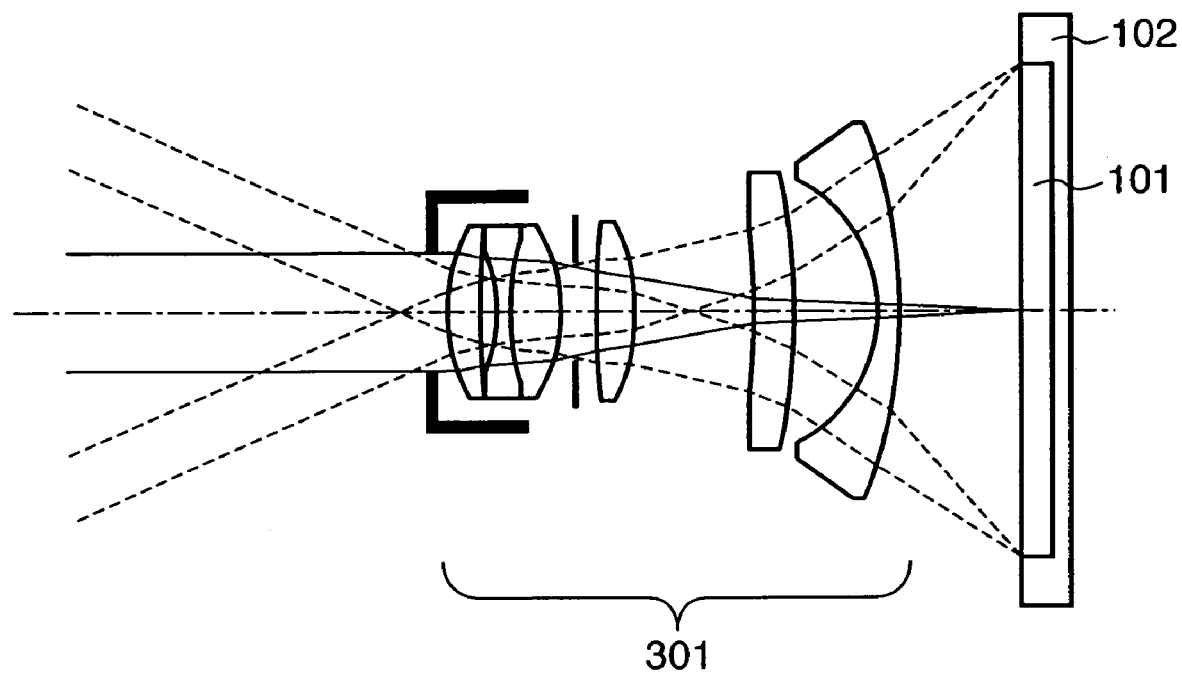
FIG. 8 is a view showing the state in which a photographing lens is adapted to an image sensor.
Figure 9:
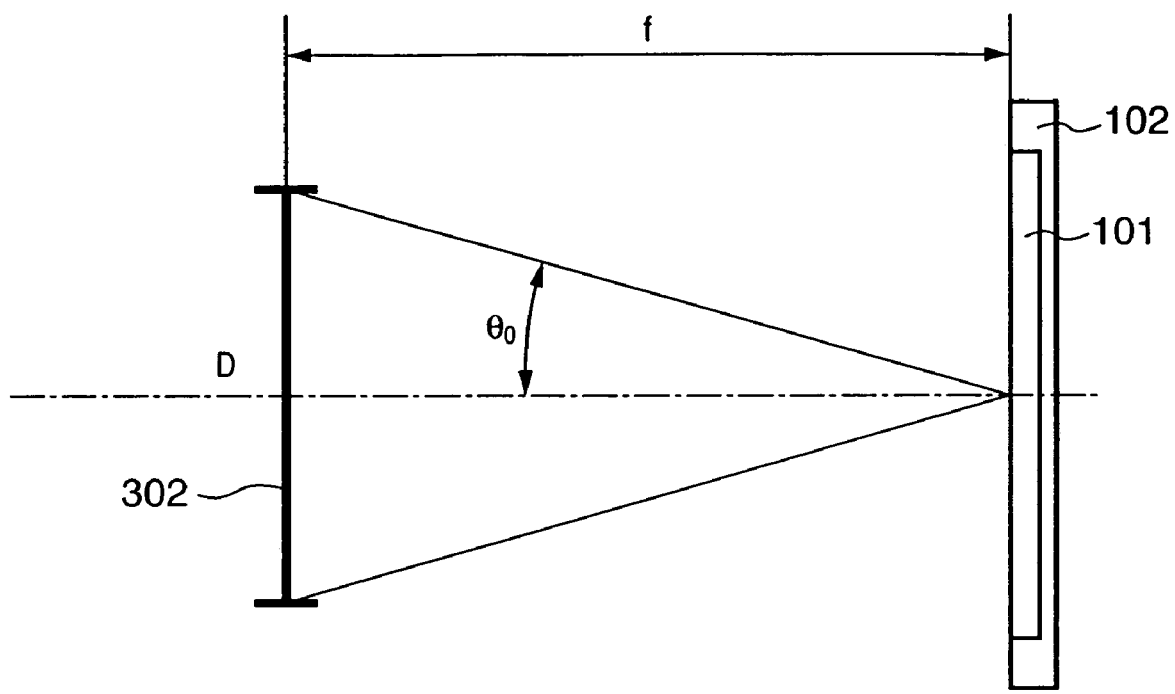
FIG. 9 is a view showing the relationship between the pupil of the photographing lens and light with respect to a central pixel.

FIG. 8 shows the state in which a photographing lens 301 is attached to an image sensor 102. All incident light rays to the lens system and exit light rays from it pass through the pupil of the lens system. FIG. 9 shows the state of light near the center of the optical axis of the photographing lens 301 (near the center of the image sensor 102) by using a pupil 302 of the lens. Letting D and F be the pupil diameter and F number, respectively, of the photographing lens 301, and f be the pupil distance (the distance from the position of the pupil of the photographing lens 301 to the image sensor 102), $$D=f/F \quad (1\text{-}1)$$

Also, letting θ0 be the angle which light coming from the perimeter of the pupil makes with the center of the optical axis, $$\sin θ0 = \tfrac{1}{2}F \quad (1\text{-}2)$$

The shape of the taper portion 32 is designed on the basis of:

(1) Light having the largest angle is incident on a pixel 100 and totally reflected near the incident portion (the uppermost portion) of the taper portion 32; and (2) The totally reflected light is incident on the square pillar portion 31 (a vertical surface 31a) on the opposite side and totally reflected again.

In this manner, all light rays incident on the taper portion 32 are incident on the vertical surface 31a on the opposite side, so these light rays are always totally reflected even when they are incident on a vertical surface 31b on the opposite side again. Accordingly, all light rays are guided to the photoelectric conversion portion 2 directly or after being totally reflected several times in the well.

Since light having the largest angle is light coming from the perimeter of the pupil 302 of the photographing lens, the angle this light makes with the optical axis of the photographing lens is θ0. Letting θ0' be the exit angle when this light is incident on the high refractive index portion 3 (the angle which light transmitted through the high refractive index portion 3 makes with the normal of the high refractive index portion 3), n0 be the refractive index of the upper portion (the space above the surface of the high refractive index portion 3) of the image sensor 102, and n1 be the refractive index of the high refractive index portion 3, $$n0 \sin θ0 = n1 \sin θ0'$$

Since n0 is the refractive index of air, $$\sin θ0 = n1 \sin θ0' \quad (2\text{-}1)$$

is obtained if n0=1. From equations (1-2) and (2-1), $$\sin θ0' = \tfrac{1}{2}n1F \quad (2\text{-}1)'$$

Also, from the geometrical relationship, letting θ be the angle the optical axis of the photographing lens makes with the taper surface, $$θ2+θ0'+θ=90° \quad (2\text{-}2)$$

Since θ3=θ and the incident angle is the same as the reflection angle, $$θ2=θ+θ1 \quad (2\text{-}3)$$

From equations (2-2) and (2-3), $$θ1=90°−θ0'−2θ=90°−θ' \quad (2\text{-}4)$$

is obtained if θ'=θ0'+2θ.

Since incident light is totally reflected by the taper portion, letting n2 be the refractive index of the low refractive index portion 4, $$\sin θ2 \geq n2/n1 \quad (3\text{-}1)$$

Letting H1 be the height of the taper portion, $$H1=(x1−x2)/2 \tan θ \quad (3\text{-}2)$$

Also, letting H2 be the height when light reflected by the taper portion reaches the opposite surface, $$\tan θ1 = H2/\{x1−(x1−x2)/2\} = 2H2/(x1+x2)$$

Accordingly, $$H2=(x1+x2)\tan θ1/2 \quad (3\text{-}3)$$

Since light totally reflected by the taper portion reaches the opposite vertical surface, it is only necessary to satisfy $$H1 \leq H2 \quad (3\text{-}4)$$

Accordingly, from expressions (3-2), (3-3), and (3-4), $$(x1−x2)/2 \tan θ \leq (x1+x2)\tan θ1/2$$

Since tan θ takes a positive value, the above expression can be rearranged to $$(1+\tan θ \tan θ1)·x2 \geq (1−\tan θ \tan θ1)·x1$$

Furthermore, since both (1+tan θ tan θ1) and x1 take positive values, $$x2/x1 \geq (1−\tan θ \tan θ1)/(1+\tan θ \tan θ1) \quad (3\text{-}5)$$

In addition, by using equation (2-4), expression (3-5) can be rearranged to $$x2/x1 \geq (1−\tan θ/\tan θ')/(1+\tan θ/\tan θ') \quad (3\text{-}6)$$

where θ'=θ0'+2θ.

Also, to realize total reflection of light incident on the vertical surface 31a, $$\sin θ1 \geq n2/n1 \quad (3\text{-}7)$$

must hold at the same time. When θ' is used, this relation is represented by $$\cos θ' \geq n2/n1 \quad (3\text{-}7)'$$

Figure 10:
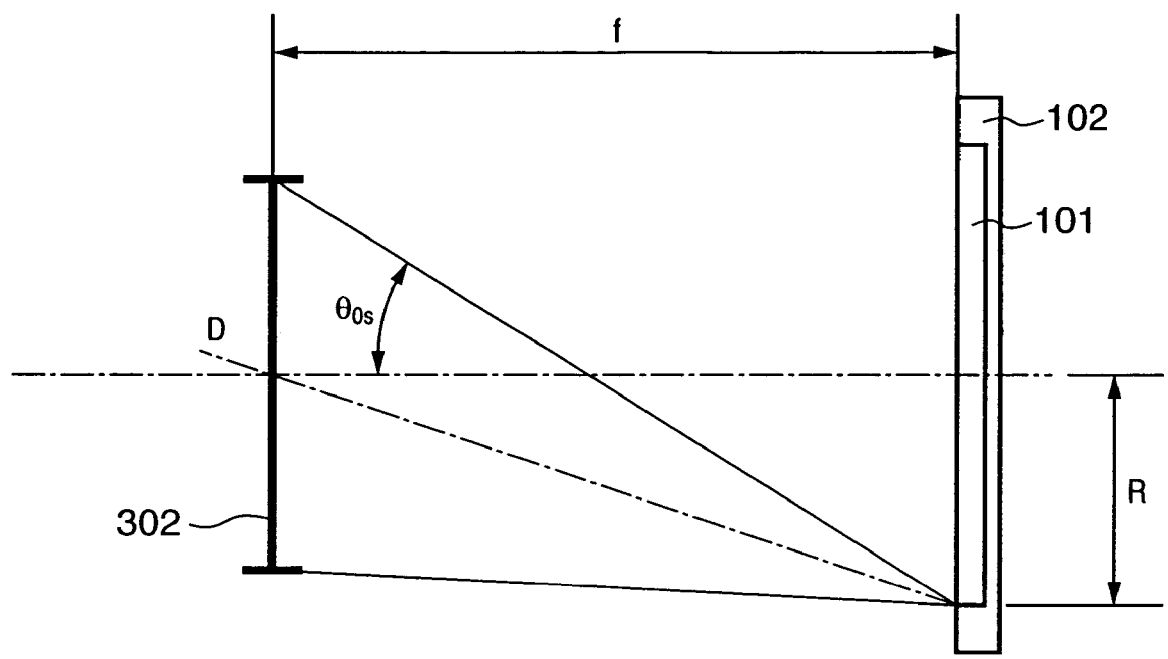
FIG. 10 is a view showing the relationship between the pupil of the photographing lens and light with respect to a peripheral pixel.

Light incident on a pixel in the peripheral portion will be described below. In the peripheral portion, as shown in FIG. 10, light coming from the pupil peripheral portion positioned on the opposite side of a pixel of interest with the center of the optical axis sandwiched between them has a largest angle. Letting θ0s be this angle and R be the distance from the center of the optical axis to the pixel of interest, $$\tan θ0s=(D/2+R)/f=D/2f+R/f=\tfrac{1}{2}F+R/f$$

If θ0s is not so large, $$\tan θ0s \approx \sin θ0s$$

Therefore, the above expression is rewritten as $$\sin \theta 0s = \tfrac{1}{2}F + R/f \quad (4\text{-}1)$$

As is apparent from comparison with equation (1-2), only a term R/f is added. Since R=0 in the central portion, equation (4-1) holds even in the central portion. Therefore, the maximum angle of incident light from the central portion to the peripheral portion can be calculated by modifying (2-1)' into $$\sin \theta 0' = \tfrac{1}{2}n1F + R/n1f \quad (2\text{-}1)''$$

The behavior after the light is incident on the high refractive index portion 3 is the same as described above except that the angle of incident light satisfies equation (2-1)".

From the foregoing, relations for determining the shape of the taper portion are as follows.

$$x2/x1 \geq (1 - \tan \theta / \tan \theta')/(1 + \tan \theta / \tan \theta')$$

$$\cos \theta' \geq n2/n1$$

$$\theta' = \theta 0' + 2\theta$$

$$\sin \theta 0' = \tfrac{1}{2}n1F + R/n1f$$

Although expression (3-1) is not included in these relations, $\theta 2 \geq \theta 1$ is obvious from equation (2-3). Accordingly, $$\sin \theta 2 \geq \sin \theta 1 \geq n2/n1$$

This indicates that if expression (3-7) or (3-7)' holds, expression (3-1) holds at the same time.

Actual numerical values will be applied in order to verify these relations. Assume that the refractive index n1 of the high refractive index portion 3 is 2.0, the refractive index n2 of the low refractive index portion 4 is 1.46, the F number of the photographing lens is 2.8, the pupil distance f is 60 mm, and an imaging region 101 has 2,400 (long side)×1,600 (short side) pixels at a pixel pitch of 3 μm, i.e., has a diagonal dimension of about 8.7 mm. First, calculations are performed for a pixel near the center of the optical axis of the photographing lens. From expressions (2-4) and (3-7)', $$\theta 0' = 5.12°$$

$$\theta' \leq 43.11°$$

FIG. 13 shows calculates done by applying appropriate values to the inclination angle θ of the taper portion. That is, FIG. 13 shows the results of calculations performed for each 1° of the inclination angle θ from 15° to 20°. When the inclination angle θ is 19° or more, the above relations are not met any more. Therefore, the inclination angle θ must be less than 19°. When the inclination angle θ is 18° and the width x2 of the square pillar portion 31 of the high refractive index portion 3 is 1.2 μm, x1 need only be 2.6 μm or less.

Results as shown in FIG. 14 are obtained in the peripheral portion. From the value of θ', the inclination angle θ need only be less than 13°. When the inclination angle θ is 12°, therefore, and x2 of the square pillar portion 31 of the high refractive index portion is 1.2 μm, the maximum value of x1 is 1.95 μm. Accordingly, the taper portion need only be formed such that the inclination angle θ of the taper portion is 18° at pixels near the center of the optical axis of the photographing lens 301, and gradually decreases toward the periphery to become 12° in the diagonal position. Alternatively, the conditions are also met even when the inclination angle θ is 12° at every pixel.

Second Embodiment

Figure 11:
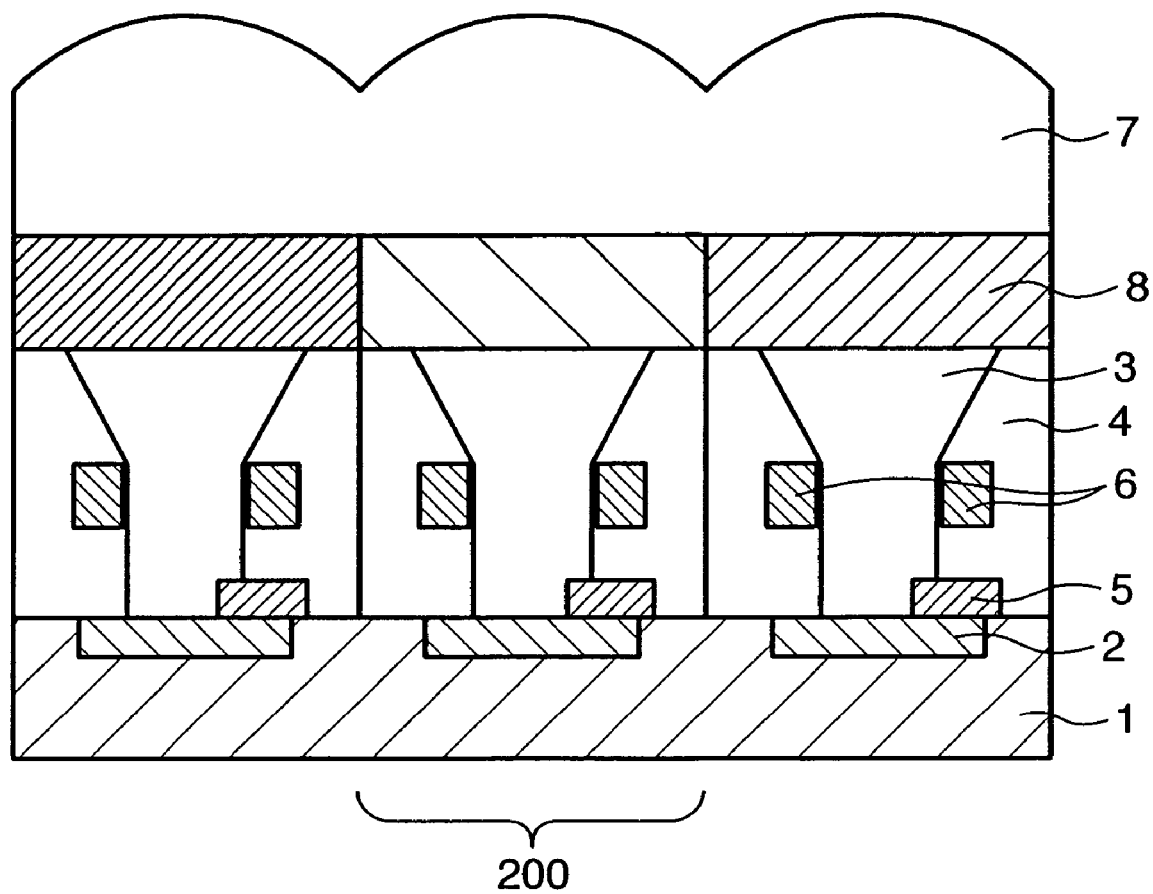
FIG. 11 is a view showing the second embodiment of the present invention.

FIG. 11 shows the second embodiment of the present invention. Referring to FIG. 11, the same reference numerals as in the first embodiment denote parts having the same functions. Reference numeral 7 denotes microlenses which collect light in a wide range from an object; and 8, a color filter as a wavelength selector which separates colors of an object in order to generate a color image.

Each microlens 7 has a spherical shape projecting upward and has a positive lens power. Accordingly, the microlens 7 concentrates light reaching the microlens 7 to a photoelectric conversion portion 2. Since a large amount of light rays can be collected into the photoelectric conversion portion 2, the sensitivity of an image sensor can be increased.

Figure 12:
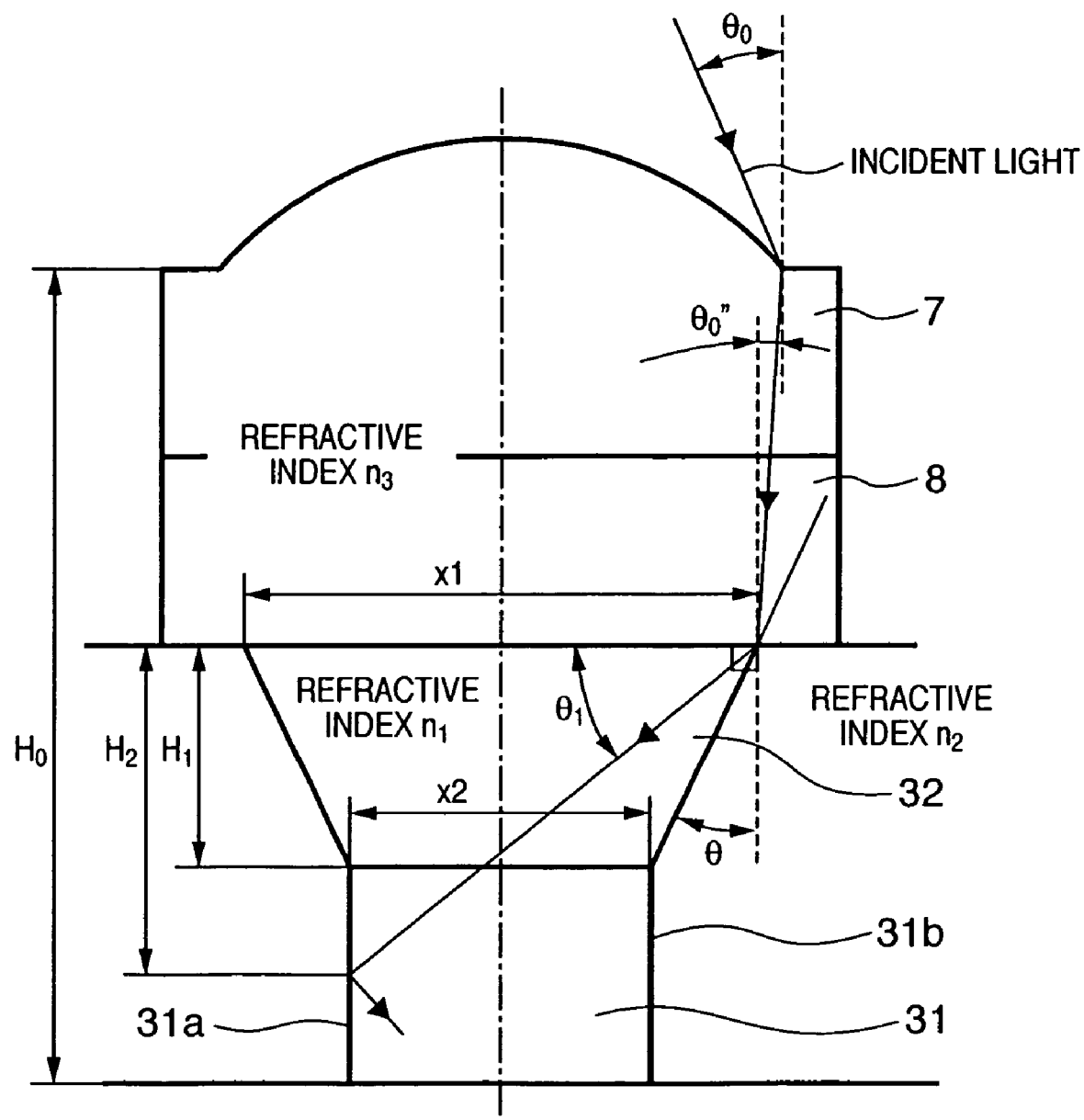
FIG. 12 is a view showing the state of light in a high refractive index portion of the second embodiment.
Figure 17:
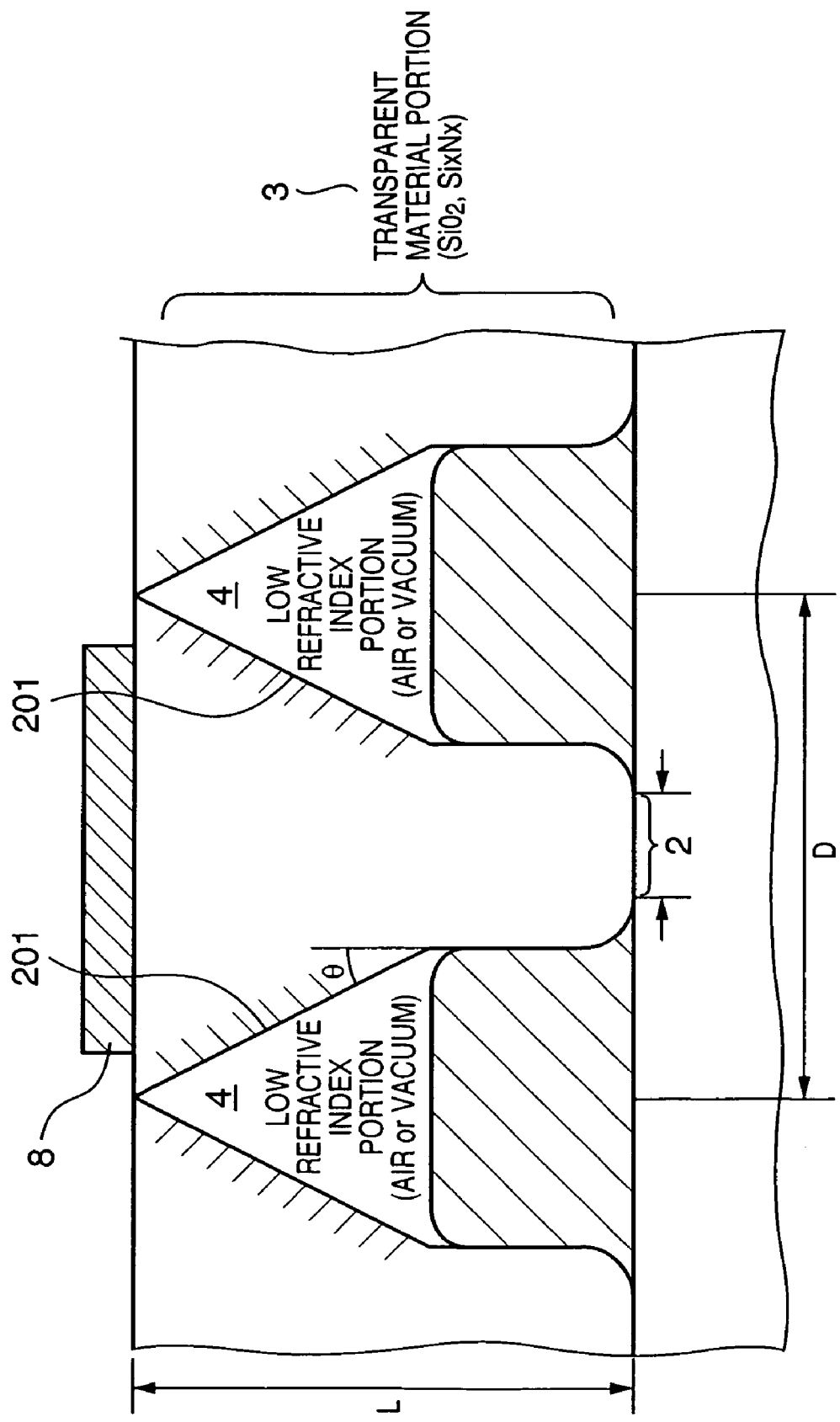
FIG. 17 is a view showing prior art.
Figure 18:
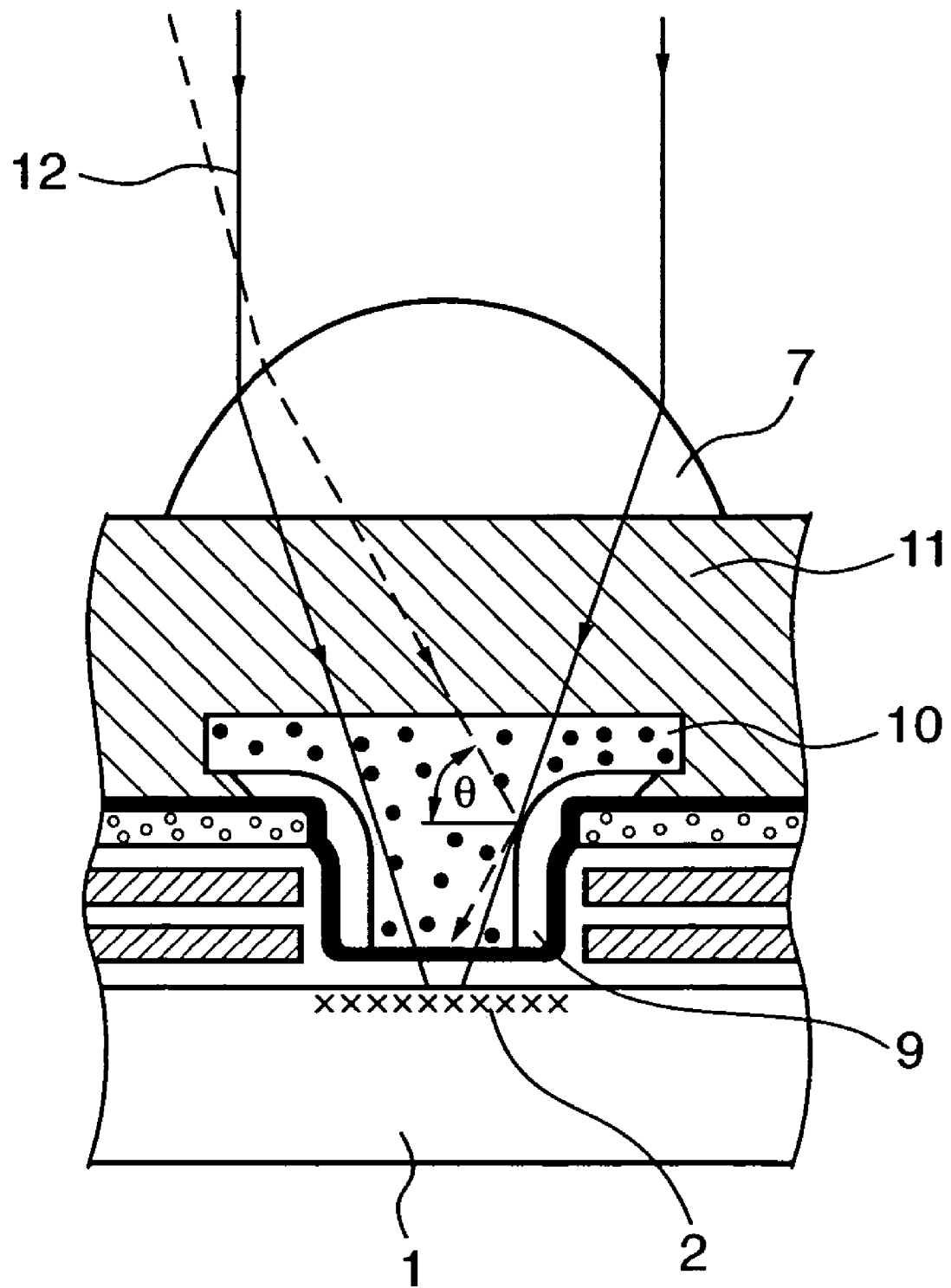
FIG. 18 is a view showing another prior art.

FIG. 12 shows the behavior of light incident on a pixel 200.

The relations of a pupil diameter D, F number F, and pupil distance f of a photographing lens 301, and a largest incident light angle θ0 are the same as equations (1-1) and (1-2) explained in the first embodiment. First, an angle θ" this light makes with the optical axis when reaching the entrance of a taper portion of a high refractive index portion 3 is calculated. Assuming that an image of the pupil of the photographing lens 301 is formed on the photoelectric conversion portion 2 by the lens effect of the microlens 7, $$y'/(D/2) = H0/f$$

$$y' = DH0/2f = H0/2F \quad (4\text{-}1)$$

where y' is the radius of the formed image. In the above equation, the position of the major surface is approximated to the lower surface (where the spherical surface and planar surface intersect) of the microlens 7, since the pupil distance f of the photographing lens is much larger than a height H0 of the microlens 7. Also, the refractive index of the lens during image formation must be calculated by taking account of a refractive index n3 of the microlens 7 and a refractive index n1 of the high refractive index portion 3. For the sake of simplicity, however, assume that the microlens 7 is filled with a material having the refractive index n1. Letting r be the aperture diameter (the microlens diameter when viewed from the upper surface) of the microlens 7, $$\tan(-\theta 0'') \approx \sin(-\theta 0'') = (r - y')/H0 = r/H0 - \tfrac{1}{2}F$$

The negative sign is attached to θ0" because the direction of the angle changes from that in the first embodiment. When the above expression is rearranged, $$\sin \theta 0'' = \tfrac{1}{2}F - r/H0 \quad (4\text{-}2)$$

Accordingly, the angle θ0' of light incident on the taper portion of the high refractive index portion 3 is $$\sin \theta 0' = (n3/n1)\sin \theta 0'' = (n3/n1) \cdot (\tfrac{1}{2}F - r/H0) \quad (4\text{-}3)$$

The behavior of the light after it enters the high refractive index portion 3 is the same as described above except that the angle of the incident light satisfies equation (4-3).

From the foregoing, relations which the shape of the taper portion must satisfy when the image sensor has the microlenses are $$x2/x1 \geq (1 - \tan \theta / \tan \theta')/(1 + \tan \theta / \tan \theta')$$

$$\cos \theta' \geq n2/n1$$

$$\theta' = \theta 0' + 2\theta$$

$$\sin \theta 0' = (n3/n1) \cdot (\tfrac{1}{2}F - r/H0)$$

Light incident on a pixel in the peripheral portion will be described below. As described in the first embodiment, letting R be the distance from the center of the optical axis to a pixel of interest, (R/f) is added to the right side of the relation of θ0″ represented by equation (4-2). Therefore, equation (4-3) is rewritten as $$\sin \theta 0' = (n3/n1) \cdot (\frac{1}{2}F - r/H0 + R/f) \quad (4\text{-}3)'$$

Since this equation holds even in the central portion, the following relations need only hold in every region.

$$x2/x1 \geq (1-\tan\theta/\tan\theta')/(1+\tan\theta/\tan\theta')$$

$$\cos\theta' \geq n2/n1$$

$$\theta' = \theta 0' + 2\theta$$

$$\sin\theta 0' = (n3/n1)\cdot(\frac{1}{2}F - r/H0 + R/f)$$

Actual numerical values will be applied in order to verify these relations. Assume that the refractive index n1 of the high refractive index portion 3 is 2.0, a refractive index n2 of a low refractive index portion 4 is 1.46, the F number of the photographing lens is 2.8, the refractive index n3 of the microlens 7 and color filter 8 is 1.58, a pupil distance f is 60 mm, and an imaging region 101 has 2,400 (long side)×1,600 (short side) pixels at a pixel pitch of 3 μm, i.e., has a diagonal dimension of about 8.7 mm. Assume also that the height H0 from the lower surface of the microlens 7 to the photoelectric conversion portion is 5.0 μm (i.e., the height from the lower surface of the microlens 7 to the lower surface of the color filter 8 is 2.5 μm, and the height of the high refractive index portion 3 is 2.5 μm), and the aperture diameter r of the microlens 7 is 1.4 μm. First, calculations are performed for pixels near the center of the optical axis of the photographing lens. From expressions (2-4) and (4-3)', $$\theta 0' = -5.13°$$

$$\theta' \leq 43.11°$$

FIG. 15 shows calculates done by applying appropriate values to the inclination angle θ of the taper portion. That is, FIG. 15 shows the results of calculations performed for each 1° of the inclination angle θ from 20° to 25°. When the inclination angle θ is 24° or more, the above relations are not met any more. Therefore, the inclination angle θ must 23° or less. When the inclination angle θ is 23° and a width x2 of a square pillar portion 31 of the high refractive index portion 3 is 1.2 μm, x1 is 3.43 μm or less, i.e., a full pixel can be used.

Results as shown in FIG. 16 are obtained in the peripheral portion. From the value of θ', the inclination angle θ need only be 21° or less. When the inclination angle θ is 21°, therefore, and x2 of the square pillar portion 31 of the high refractive index portion 3 is 1.2 μm, the maximum value of x1 is 2.99 μm. That is, the entrance can be widened to the size of a substantially full pixel in this case as well. In all pixels, therefore, the taper angle is set at 21°, and the width x1 of the entrance is set to be relatively small, e.g., about 2.2 μm because light is narrowed by the microlens 7. Consequently, the height of the taper portion becomes 1.3 μm, i.e., relatively small, so a well-shaped structure can be obtained.

In addition, the center of the optical axis of the microlens 7 is positioned in the center of each pixel in the entire image sensor, or shifts from the center of each pixel toward the center of the optical axis of the photographing lens 301 as the distance from the center of the optical axis of the photographing lens (the center of the imaging portion) increases. This is so because when light concentrated by the microlens 7 forms an image on the photoelectric conversion portion 2, this light gradually shifts outward from the center of the pixel as the distance from the center of the optical axis of the photographing lens 301 increases. This phenomenon appears more significantly as the pupil distance f of the photographing lens decreases, so the shift amount of the microlens 7 must be increased. Even when the microlens 7 is shifted as described above, the state of light traveling from the microlens 7 to the photoelectric conversion portion 2 remains the same. Therefore, the relations described above can be similarly used.

As described above, in the first embodiment described earlier, an image sensing device having a photographing lens which forms an object image includes an image sensor near the prospective image formation plane of the photographing lens.

In this image sensor, a plurality of photoelectric conversion portions are arranged one-dimensionally or two-dimensionally, a high refractive index portion is formed on the photoelectric conversion portion to cover at least part of the photoelectric conversion portion, and a low refractive index portion is formed around the high refractive index portion. The interface between the high refractive index portion and low refractive index portion has a surface substantially parallel to the optical axis of the photographing lens, and a tapered inclined surface having a substantially uniform angle by which the aperture area decreases toward the photoelectric conversion portion. Letting $$\theta' = \theta 0' + 2\theta$$

$$\sin\theta 0' = \frac{1}{2}n1F + R/n1f$$

x2/x1: taper exit width/taper entrance width
θ: inclination angle (°) of taper portion
n1: refractive index of high refractive index portion
n2: refractive index of low refractive index portion
F: F number of photographing lens
R: distance from optical axis of photographing lens
f: pupil distance of photographing lens, the shape of the taper surface which efficiently guides incident light to the photoelectric conversion portion by reliably totally reflecting the light can be determined on the basis of $$1 > x2/x1 \geq (1-\tan\theta/\tan\theta')/(1+\tan\theta/\tan\theta')$$

$$\cos\theta' \geq n2/n1$$

Also, in the second embodiment, an image sensing device having a photographing lens which forms an object image includes an image sensor near the prospective image formation plane of the photographing lens.

In this image sensor, a plurality of photoelectric conversion portions are arranged one-dimensionally or two-dimensionally, a microlens is formed to concentrate externally light, a high refractive index portion is formed on the photoelectric conversion portion to cover at least part of the photoelectric conversion portion, and a low refractive index portion is formed around the high refractive index portion. The interface between the high refractive index portion and low refractive index portion has a surface substantially parallel to the optical axis of the photographing lens, and a tapered inclined surface having a substantially uniform angle by which the aperture area decreases toward the photoelectric conversion portion. Letting $$\theta' = \theta 0' + 2\theta$$

$$\sin\theta 0' = (n3/n1)\cdot(\frac{1}{2}F - r/H0 + R/f)$$

n3: refractive index of microlens
r: aperture radius of microlens
H0: distance from lower end of microlens to photoelectric conversion portion, incident light can be efficiently guided to the photoelectric conversion portion by reliably totally reflecting the light by the taper surface even in the image sensor having the microlens, on the basis of $$1 > x2/x1 \geq (1-\tan\theta/\tan\theta')/(1+\tan\theta/\tan\theta')$$

$$\cos\theta' \geq n2/n1$$

In addition, the taper shape changes on the basis of the above relations in accordance with the distance from the center of the optical axis of the photographing lens. Accordingly, even when the incident angle changes due to the distance from the center, the light utilization efficiency remains almost unchanged from those of pixels near the center.

Furthermore, the optical axis of the microlens is offset in the direction of the center of the optical axis of the photographing lens in accordance with the distance form the center of the optical axis of the photographing lens. As a consequence, light can be efficiently collected even when the microlens is used.

As has been explained above, each of the embodiments can provide the structure of an image sensor capable of efficiently collecting light in the center and in the periphery of an imaging plane, and also capable of collecting slant incident light which changes in accordance with the F number of a photographing lens.

The present invention is not limited to the above embodiments and various changes and modifications can be made within the spirit and scope of the present invention. Therefore, to apprise the public of the scope of the present invention, the following claims are made.

CLAIM OF PRIORITY

This application claims priority from Japanese Patent Application No. 2004-056667 filed on Mar. 1, 2004, which is hereby incorporated by reference herein.

What is claimed is:

1. An image sensor comprising:
a plurality of photoelectric conversion portions each of which photoelectrically converts an object image formed by a photographing lens;
a high refractive index portion which is placed on each of said plurality of photoelectric conversion portions to cover at least part of said photoelectric conversion portion, and includes a first portion positioned near said photoelectric conversion portion and formed into a shape of a square pillar or column having a substantially uniform thickness, and a second portion formed contiguously with said first portion and having a taper shape whose aperture area increases from a side close to said photoelectric conversion portion to a side close to said photographing lens; and
a low refractive index portion placed around said high refractive index portion, and having a refractive index lower than that of said high refractive index portion,
wherein letting x1 be an aperture width on a side at which the aperture area of said taper shape is large, x2 be an aperture width on a side at which the aperture area of the taper shape is small, θ° be an inclination angle of the taper shape, n1 be the refractive index of said high refractive index portion, n2 be the refractive index of said low refractive index portion, F be an F number of said photographing lens, R be a distance from a center of an optical axis of said photographing lens to said photoelectric conversion portion, and f be a distance from a position of a pupil of said photographing lens to an imaging plane in which said plurality of photoelectric conversion portions are arranged, said high refractive index portion is formed into a shape which satisfies relations represented by $$1 > x2/x1 \geq (1-\tan\theta/\tan\theta')/(1+\tan\theta/\tan\theta')$$

$$\cos\theta' \geq n2/n1$$

where $\theta' = \theta0' + 2\theta$ and $\sin\theta0' = \frac{1}{2}n1F + R/n1f$.

2. The sensor according to claim 1, wherein the taper shape is changed in accordance with the distance from the center of the optical axis of said photographing lens, such that the relations are satisfied.

3. An image sensor comprising:
a plurality of photoelectric conversion portions each of which photoelectrically converts an object image formed by a photographing lens;
a microlens which is placed between each of said plurality of photoelectric conversion portions and said photographing lens, and concentrates light to said photoelectric conversion portion;
a high refractive index portion which is placed on each of said plurality of photoelectric conversion portions to cover at least part of said photoelectric conversion portion, and includes a first portion positioned near said photoelectric conversion portion and formed into a shape of a square pillar or column having a substantially uniform thickness, and a second portion formed contiguously with said first portion and having a taper shape whose aperture area increases from a side close to said photoelectric conversion portion to a side close to said photographing lens; and
a low refractive index portion placed around said high refractive index portion, and having a refractive index lower than that of said high refractive index portion,
wherein letting x1 be an aperture width on a side at which the aperture area of said taper shape is large, x2 be an aperture width on a side at which the aperture area of the taper shape is small, θ° be an inclination angle of the taper shape, n1 be the refractive index of said high refractive index portion, n2 be the refractive index of said low refractive index portion, F be an F number of said photographing lens, R be a distance from a center of an optical axis of said photographing lens to said photoelectric conversion portion, f be a distance from a position of a pupil of said photographing lens to an imaging plane in which said plurality of photoelectric conversion portions are arranged, n3 be a refractive index of said microlens, r be an aperture radius of said microlens, and H0 be a distance from an end portion, which is close to said photoelectric conversion portion, of said microlens to said photoelectric conversion portion, said high refractive index portion is formed into a shape which satisfies relations represented by $$1 > x2/x1 \geq (1-\tan\theta/\tan\theta')/(1+\tan\theta/\tan\theta')$$

$$\cos\theta' \geq n2/n1$$

where $\theta' = \theta0' + 2\theta$ and $\sin\theta0' = (n3/n1)\cdot(\frac{1}{2}F - r/H0 + R/f)$.

4. The sensor according to claim 3, wherein the taper shape is changed in accordance with the distance from the center of the optical axis of said photographing lens, such that the relations are satisfied.

5. The sensor according to claim 3, wherein an optical axis of said microlens is offset to the center of the optical axis of said photographing lens in accordance with the distance from the center of the optical axis.

* * * * *